United States Patent
Rodriguez et al.

(10) Patent No.: US 10,088,506 B2
(45) Date of Patent: Oct. 2, 2018

(54) METHOD FOR DETECTING A FAULT CONDITION IN AN ELECTRICAL MACHINE

(71) Applicant: ABB Research Ltd., Zurich (CH)

(72) Inventors: Pedro Rodriguez, Vasteras (SE); Cajetan Pinto, Mumbai (IN); Maciej Orman, Radziszow (PL); Michal Orkisz, Krakow (PL); Ulf Ahrend, Karlsruhe (DE); Rolf Disselnkötter, Mauer (DE); Pawel Rzeszucinski, Kedzierzyn-Kozle (PL); James Ottewill, Ruislip Middlesex (GB)

(73) Assignee: ABB Research Ltd., Zurich (CH)

( * ) Notice: Subject to any disclaimer, the term of this patent is extended or adjusted under 35 U.S.C. 154(b) by 135 days.

(21) Appl. No.: 14/440,271

(22) PCT Filed: Oct. 3, 2013

(86) PCT No.: PCT/EP2013/070623
§ 371 (c)(1),
(2) Date: May 1, 2015

(87) PCT Pub. No.: WO2014/067742
PCT Pub. Date: May 8, 2014

(65) Prior Publication Data
US 2015/0276823 A1    Oct. 1, 2015

(30) Foreign Application Priority Data
Nov. 1, 2012    (EP) .................................. 12190951

(51) Int. Cl.
*G01R 23/00*    (2006.01)
*G01R 19/02*    (2006.01)
*G01R 31/34*    (2006.01)

(52) U.S. Cl.
CPC .............. *G01R 19/02* (2013.01); *G01R 23/00* (2013.01); *G01R 31/34* (2013.01); *G01R 31/343* (2013.01); *G01R 31/346* (2013.01)

(58) Field of Classification Search
CPC ............................... G01R 19/02; G01R 23/00
(Continued)

(56) References Cited

U.S. PATENT DOCUMENTS

| 7,253,634 B1 | 8/2007 | Kasztenny et al. |
| 7,956,762 B2 | 6/2011 | Bailey |

(Continued)

FOREIGN PATENT DOCUMENTS

| GB | 2157005 A | 10/1985 |
| JP | 2004328899 A | * 11/2004 |

(Continued)

OTHER PUBLICATIONS

Wan Shuting, et al., "A Compositive Diagnosis Method on Turbine-Generator Rotor Winding Inter-turn Short Circuit Fault", Industrial Electronics, 2006 IEEE International Symposium on (vol. 3) pp. 162-166.

(Continued)

*Primary Examiner* — Sujoy Kundu
*Assistant Examiner* — Xiuquin Sun
(74) *Attorney, Agent, or Firm* — Whitmyer IP Group LLC

(57) ABSTRACT

A method for identifying a fault condition in an electrical machine in which at least a stator or a rotor has parallel winding branches is disclosed. A measurement is carried out for obtaining a set of circulating current values between two parallel winding branches of which each winding branch includes a single coil. A frequency analysis is applied on the set of circulating current values to obtain at least one (Continued)

frequency component. A fault condition of the electrical machine is determined on the basis of the at least one frequency component.

18 Claims, 2 Drawing Sheets

(58) Field of Classification Search
USPC .......................................................... 702/75
See application file for complete search history.

(56) References Cited

U.S. PATENT DOCUMENTS

| | | | |
|---|---|---|---|
| 8,253,365 B2* | 8/2012 | Yeh ...................... | G01R 31/343 318/400.15 |
| 2007/0096681 A1* | 5/2007 | Bilac ...................... | H02P 1/26 318/729 |
| 2013/0013138 A1* | 1/2013 | Lu ........................ | B60L 3/0061 701/22 |

FOREIGN PATENT DOCUMENTS

| JP | 2006280158 A | 10/2006 |
|---|---|---|
| WO | 02089305 A1 | 11/2002 |

OTHER PUBLICATIONS

El Hachemi Benbouzid, "A review of induction motors signature analysis as a medium for faults detection", Industrial Electronics, IEEE Transactions on (vol. 47, Issue: 5 ), Oct. 2000, pp. 984-993.
Torlay, JT, et al., "Analysis of shaft voltages and circulating currents in the parallel-connected windings in large synchronous generators", Electric Power Components and Systems, vol. 30, Issue: 2, pp. 135-149, Published: Feb. 2002.
Wan Shuting, et al., "Analysis of Stator Winding Parallel-Connected Branches Circulating Current and Its Application in Generator Fault Diagnosis", Industry Applications Conference, 2005. Fourtieth IAS Annual Meeting. Conference Record of the 2005, Oct. 2-6, 2005 (vol. 1 ), p. 42-45.
Wan Shuting, et al., "Analysis on stator circulating current characteristics of turbo-generator under eccentric faults", Power Electronics and Motion Control Conference, May 2009. IPEMC '09. IEEE 6th International, pp. 2062-2067.
Foggia, A, et al., "Circulating Current Analysis in the Parallel-Connected Windings of Synchronous Generators under Abnormal Operating Conditions", Electric Machines and Drives, 1999. International Conference IEMD '99, pp. 634-636, May 1999.
P. Rodriguez, et al., "Current-force- and vibration based techniques for induction motor condition monitoring", 2007, 181 pages.
Negrea MD (2006) Electromagnetic flux monitoring for detecting faults in electrical machines, Doctoral dissertation, Helsinki University of Technology. Department of Electrical and Communications Engineering, pp. 1-142.
International Preliminary Report on Patentability Application No. PCT/EP2013/070623 Completed: Jan. 7, 2015 24 pages.
International Search Report and Written Opinion of the International Searching Authority Application No. PCT/EP2013/070623 Completed: Feb. 5, 2014; dated Feb. 14, 2014 18 pages.
S. Pöyhönen, M. Negrea, P. Jover, A. Arkkio, H. Hyötyniemi, (2003) "Numerical magnetic field analysis and signal processing for fault diagnostics of electrical machines", COMPEL—The international journal for computation and mathematics in electrical and electronic engineering, vol. 22 Iss: 4, pp. 969-981.

* cited by examiner

| Frequency | Dynamic Eccentricity | Static Eccentricity | Inter-turn rotor | Inter-turn stator |
|---|---|---|---|---|
| Rotational frequency and multiples, $kf_r$ | ---- | ---- | XXX | ---- |
| Odd numbers of the supply frequency, $(2k + 1)f_s$ | ---- | ---- | ---- | XXX |
| Combination of supply and rotation frequency, $(2k + 1)f_s \pm f_r$ | XXX | X | ---- | ---- |
| Multiples of supply frequency, $kf_s$ | ---- | XXX | ---- | ---- |

$k = 0, 1, 2, 3, \ldots \ldots$

"XXX"  Predominant harmonic
"XX"   Moderate amplitude
"X"    No predominant
"----" No change

*Fig. 3*

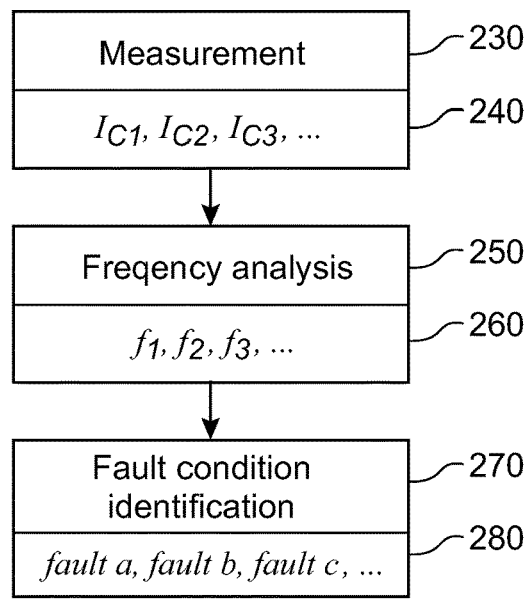

*Fig. 4*

METHOD FOR DETECTING A FAULT CONDITION IN AN ELECTRICAL MACHINE

FIELD OF THE INVENTION

The present invention relates to a method and a system for identifying a fault in an electrical machine.

BACKGROUND OF THE INVENTION

Detection of faults in electrical machines is an important issue for ensuring a reliable functioning of the machine. The earlier a fault is detected the better the maintenance can be planned thus avoiding uncontrolled machine stops and serious damages from occurring. Conventionally both mechanical and electrical characteristics of machines are used for identifying faults. For example, mechanical vibrations and the behavior of electrical currents within the machine have been used as fault indicators. Circulating currents between parallel connected winding branches have been found to be a good fault indicator since they are ideally equal to zero for a normal condition and increase due to any asymmetry within the machine. Circulating currents enable detection of faulty conditions at a very early stage, for example a crack of the rotor bars (before the bar is totally broken), inter-turn short-circuits, eccentricity problem, etc.

GB2157005A discloses a spectrum analysis of circulating currents between two parallel winding branches in a stator of a two-pole alternator for detecting different types of faults. According to GB2157005A the relevant harmonics for analyzing the spectrum of the circulating currents are even harmonics of the supply frequency (50 Hz).

WAN SHUTING et al: "A Compositive Diagnosis Method on Turbine-Generator Rotor Winding Inter-turn Short Circuit Fault" discloses detecting an inter-turn short circuit in a rotor by analysing circulating currents.

US7253634B1 discloses detecting stator ground faults in a generator by analysing circulating currents. US7253634B1 discloses inter alia measuring the circulating currents in different electrical phases of the machine.

MOHAMED EL HACHEMI BENBOUZID: "A Review of Induction Motors Signature Analysis as a Medium for Faults Detection" discloses a fault detection method based on signature analysis in induction motors.

Though theoretically circulating currents provide an improved method of detecting machine faults at an early stage, there are a number of practical difficulties in realizing a method of acquiring and processing the relevant data. Such practical difficulties include finding the best fault indicators and learning to interpret the results correctly. A circulating current can be measured at many different locations of the machine, and arranging the measurement is difficult because the current sensors may need to be integrated into the windings of the machine. Therefore, this method is most appropriate for high power motors and generators, where there is sufficient room to locate the current sensors inside the machine. Furthermore, special skill is needed for interpreting the measurement results correctly in order to actually be able to detect a fault condition. There remains a desire to improve the existing fault detection methods in order to more reliably detect different types of faults.

SUMMARY OF THE INVENTION

One object of the present invention is to provide an improved method for detecting faults in electrical machines. This object is achieved by the method for identifying a fault condition in an electrical machine.

According to a first aspect of the invention, there is provided a method for identifying a fault condition in an electrical machine in which at least a stator or a rotor has parallel winding branches. The method comprises the steps of: carrying out a first measurement for obtaining a first set of circulating current values between two parallel winding branches of which each winding branch comprises a single coil; applying a frequency analysis on the first set of circulating current values to obtain at least one frequency component; and determining, on the basis of the at least one frequency component, a fault condition of the electrical machine.

By measuring a circulating current between two parallel winding branches comprising a single coil, robust indicators of fault conditions in the machine can be obtained. Since the fault indicators are contained in the frequency spectrum of the circulating current, a frequency analysis is necessary for enabling the determination of the fault condition.

According to one embodiment of the invention, the fault condition is one of the following: dynamic eccentricity, static eccentricity, inter-turn short circuit in the rotor, inter-turn short circuit in the stator. The given fault conditions are those which are most common in electrical machines and which have the most practical significance, though it may be recognised by those skilled in the state of the art that the method may be used to diagnose other faults both in the electric machine and an associated load. In practice an electrical machine may suffer from a combination of the given fault conditions.

According to one embodiment of the invention, the method comprises the step of: determining, on the basis that the at least one frequency component has a value $(2k+1)f_s \pm f_r$, wherein $k=(0, 1, 2, 3, \ldots)$, $f_s$=supply frequency and $f_r$=rotational frequency of the electrical machine, that the machine suffers from dynamic eccentricity. The given frequencies have been found to be a strong indicator of dynamic eccentricity.

According to one embodiment of the invention, the method comprises the step of: determining, on the basis that the at least one frequency component has a value $kf_s$, wherein $k=(0, 1, 2, 3, \ldots)$ and $f_s$=supply frequency, that the machine suffers from static eccentricity. The given frequencies have been found to be a strong indicator of static eccentricity.

According to one embodiment of the invention, the method comprises the step of: determining, on the basis that the at least one frequency component has a value $kf_r$, wherein $k=(0, 1, 2, 3, \ldots)$ and $f_r$=rotational frequency of the electrical machine, that the machine suffers from inter-turn short circuit in the rotor. The given frequencies have been found to be a strong indicator of inter-turn short circuit in the rotor.

According to one embodiment of the invention, the method comprises the step of: determining, on the basis that the at least one frequency component has a value $(2k+1)f_s$, wherein $k=(0, 1, 2, 3, \ldots)$ and $f_s$=supply frequency, that the machine suffers from inter-turn short circuit in the stator. The given frequencies have been found to be a strong indicator of inter-turn short circuit in the stator.

According to one embodiment of the invention, the electrical machine is a synchronous electrical motor or generator. The present method is particularly effective in identifying fault conditions in synchronous electrical machines.

According to one embodiment of the invention, the first measurement is carried out with two current sensors for obtaining branch current signals from the two parallel winding branches, and the first set of circulating current values is deduced from the branch current signals using an operational amplifier or using a numerical subtraction after the branch current signals have been converted into a digital domain. A measurement arrangement according to this provision can be relatively easily implemented even when the two winding branches are distant from each other.

According to one embodiment of the invention, the first measurement is carried out with a differential current sensor. The measurement results are expected to be more accurate when a differential current sensor is used.

According to one embodiment of the invention, the first measurement is carried out between two opposite winding branches in circumferential direction of the stator. By this measure an even stronger fault indication is obtained.

According to one embodiment of the invention, the method comprises the step of carrying out a second measurement corresponding to the first measurement, the two parallel winding branches in the second measurement being different from those in the first measurement. This measure makes it possible to find out the fault position with respect to the stator.

According to one embodiment of the invention the two parallel winding branches in the second measurement are in a different electrical phase than those in the first measurement. This measure makes it possible to find out the fault position with respect to the stator in an improved way.

According to one embodiment of the invention, the method comprises the step of carrying out a measurement corresponding to the first measurement for winding branches in each electrical phase of the electrical machine. This measure makes it possible to find out the fault position with respect to the stator in a further improved way.

According to one embodiment of the invention, the fault condition of the electrical machine is determined on the basis of more than one frequency components. By this measure a higher certainty in indicating a fault condition is achieved.

According to one embodiment of the invention, the method comprises the step of comparing an amplitude of the circulating current at the frequency component with a predetermined threshold value. By implementing a threshold value for a circulating current amplitude, fault conditions can be distinguished from normal asymmetries of the machine.

According to one embodiment of the invention, the method comprises the step of: comparing a relative amplitude of the circulating current at the frequency component with a predetermined threshold value, wherein the relative amplitude is determined by an algorithm comprising a root mean square of the circulating current at the frequency component, by an algorithm comprising a factor $$20\log\frac{A_{fault\_related\_frequency}}{A_{main}},$$

or by an algorithm $$\sum_{i=1}^{n}\left(\frac{RMS(I_c)}{I_{rated}}-\left|20\log\frac{A_{fault\_related\_frequency,i}}{A_{main}}\right|\right),$$

where $RMS(I_c)$ is root mean square of the circulating current at the frequency component, $I_{rated}$ is the rated current of the machine, $A_{fault\_related\_frequency,i}$ is an amplitude of the circulating current at the $i^{th}$ frequency component, n is the number of frequency components and $A_{main}$ is an amplitude of a main current at supply frequency. By this measure fault conditions can be even better distinguished from normal asymmetries of the machine.

According to one embodiment of the invention, the first measurement is carried out during a transient operation of the electrical machine. Some fault condition related frequency components of the circulating current are prominent especially during a transient operation of the electrical machine. Analysing them contributes to an even stronger fault indication.

BRIEF DESCRIPTION OF THE DRAWINGS

The invention will be explained in greater detail with reference to the accompanying drawings, wherein FIG. 3 shows a look-up table for fault indication for the case of a synchronous motor, and FIG. 4 shows a flow chart illustrating the major steps of the method according to the invention.

DETAILED DESCRIPTION OF THE INVENTION

Figure 1:
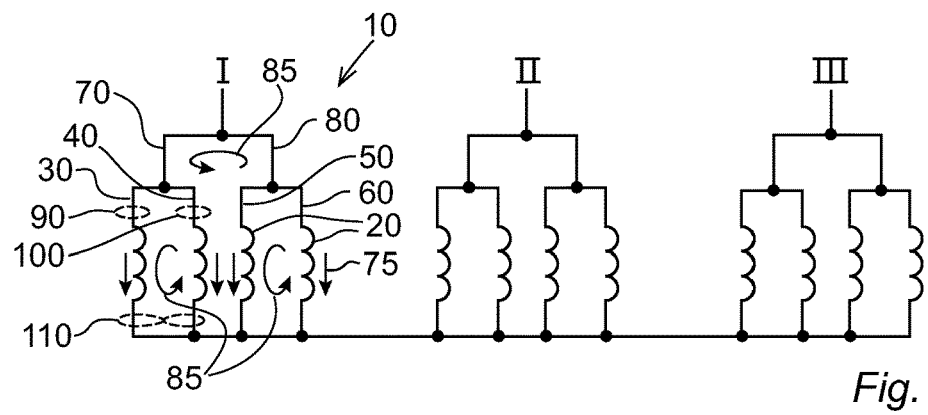
FIG. 1 shows a measurement installation according to an embodiment of the invention.

Referring to FIG. 1, a stator winding 10 of a three-phase and four-pole machine comprises four coils 20 for each electrical phase I, II, III. The coils 20 are connected in parallel in a winding arrangement comprising six winding branches 30, 40, 50, 60, 70, 80 wherein the first, second, third and fourth winding branches 30, 40, 50, 60 comprise a single coil 20, and the fifth and sixth winding branches 70, 80 comprise two coils 20 each. In practice, a coil 20 may consist of a plurality of serial connected coil sections i.e. in the context of the present invention a plurality of coil sections connected in series is equivalent with a single coil 20. When the machine is operating, electric currents are flowing through the winding branches 30, . . . 80 in accordance to the characteristics and operating conditions of the machine. Since the winding branches 30, 40, 50, 60 comprising a single coil 20 are connected in parallel at each electrical phase I, II, III, and since an ideal machine is symmetrical in structure, in theory the currents in all corresponding winding branches 30, 40, 50, 60 are identical.

The same applies to the corresponding winding branches 70, 80 comprising two coils 20 each. However, a real machine always has some asymmetry that causes the magnetic fluxes in the different coils 20 and the resulting electromotive forces (EMF) resisting the currents to differ. As a consequence, the currents induced in the different coils 20 also differ, and circulating currents 85 between the parallel connected winding branches 30, . . . 80 occur.

As indicated above, a small asymmetry is normal for every electrical machine. However, in a faulty machine asymmetries increase together with the severity of the fault condition. It is therefore practical to observe asymmetries to identify fault conditions in electrical machines. Since circulating currents 85 are ideally zero when no faults are present in the machine, they are inherently well suited for identifying asymmetries and the corresponding fault conditions. In the example of FIG. 1 a circulating current 85 is measured between a first and a second winding branch 30, 40 at a first electrical phase I. Both the first and the second winding branches 30, 40 comprise a single coil 20 in contrast to the fifth and sixth winding branches 70, 80 which each comprise two coils 20, as explained above. Alternatively, in the example of FIG. 1 the circulating current 85 can be measured between the first and the third winding branches 30, 50, or between any other combination of two winding branches 30, 40, 50, 60 comprising a single coil 20 within the same electrical phase I, II, III. It is preferable to measure the circulating current 85 between two winding branches 30, 40, 50, 60 that only comprise a single coil 20 each. The circulating current 85 between such winding branches 30, 40, 50, 60 gives a better indication of a fault condition than the circulating current 85 between winding branches 70, 80 comprising more than one coil 20, even if the measurement can be more difficult to arrange in practice.

In FIG. 1 two possible measuring arrangements are shown. The first arrangement comprises a first and a second branch current sensor 90, 100 arranged to measure the absolute currents at the respective winding branches 30, 40. The second arrangement comprises a differential sensor 110 arranged to measure the differential current between the two respective winding branches 30, 40. In the case of the first arrangement the circulating current values need to be deduced from the two measurements. This can be done by subtracting the output signals of the first and the second branch current sensors 90, 100 electrically e.g. with means of an operational amplifier, or numerically after the signals have been converted into a digital domain. The requirement to deduce the circulating current values from two measurements can be seen as a drawback, and another drawback with the first arrangement is that the measured absolute current values can be very high relative to the circulating current values of interest. The first arrangement is therefore more likely to suffer from noise than the second one. The differential sensor 110 of the second arrangement comprises a twisted sensor loop which surrounds the two winding branches 30, 40 in opposite directions such that the current induced in the twisted sensor loop directly corresponds to the circulating current 85. A drawback with the second arrangement is that in practice it can be difficult to arrange the differential measurement between two distant winding branches 30, . . . 80 inside an electrical machine.

Figure 2A:
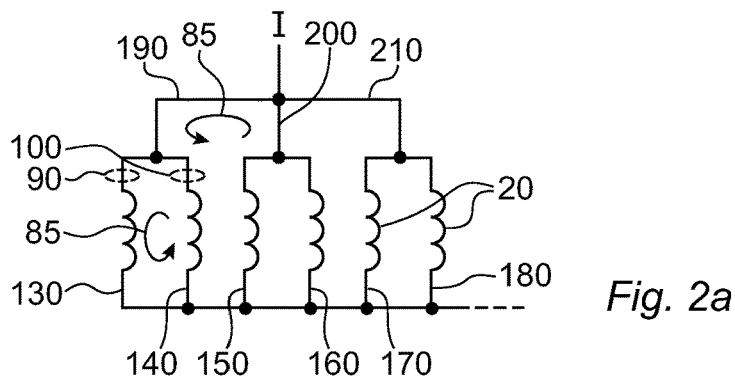
FIGS. 2a and 2b show a measurement installation according to an embodiment of the invention.
Figure 2B:
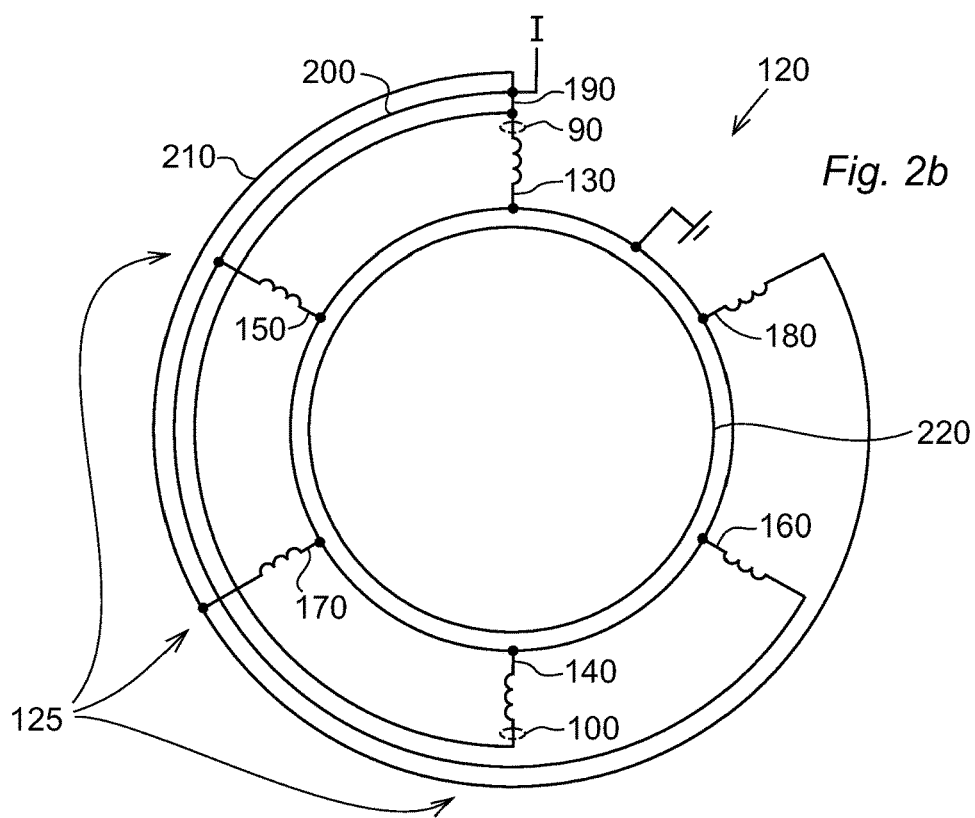

Referring to FIGS. 2a and 2b, the coils 20 for the first electrical phase I in a six-pole machine are distributed symmetrically about a circumference of a stator 120. The machine may have three or more electrical phases I, II, III, but for the purpose of measuring circulating currents 85 it is enough to consider only one electrical phase I, II, III at a time. At the first electrical phase I, there are seventh, eighth, ninth, tenth, eleventh and twelfth winding branches 130, 140, 150, 160, 170, 180 comprising a single coil 20 each. In addition, there are thirteenth, fourteenth and fifteenth winding branches 190, 200, 210 comprising two coils 20 each. According to the description above, the circulating current 85 should be measured between any combination of two winding branches 130, 140, 150, 160, 170, 180 selected from the six winding branches 130, . . . 180 comprising a single coil 20 each, i.e. the seventh to the twelfth winding branches 130, . . . 180. However, measuring the circulating current 85 between two opposite winding branches 130, . . . 180 in circumferential direction of the stator 120, such as the seventh and the eighth winding branches 130, 140 in the embodiment of FIG. 2b, results in an even stronger indication of a fault condition.

If circulating currents 85 are measured between two respective parallel winding branches 30, 40, 50, 60, 130, 140, 150, 160, 170, 180 at least at two different locations of the machine, it is possible to find out the fault position with respect to the stator 120. This can be done by extracting the spatial information by plotting one circulating current 85 against another, or by applying another technique that allows extracting the spatial information e.g. a space-frequency analysis. This is useful for example for detecting the direction of a static eccentricity. The different measurements are preferably carried out at least at two electrical phases I, II, III, such as at all electrical phases I, II, III of the machine.

From a measurement of individual branch currents, the circulating current values can be extracted according to the equation $$I_c = \frac{I_1 - I_2}{2}$$

where $I_c$ is the circulating current, $I_1$ is a first branch current and $I_2$ is a second branch current. A differential sensor 110 gives directly the value of $(I_1-I_2)$ while when using two separate branch current sensors 90, 100 this deduction needs to be carried out separately.

The measurement finally results in a set of circulating current values. It is necessary to process these values such that relevant diagnostic information can be extracted. The frequency content of a circulating current 85 can be evaluated to identify fault conditions. Therefore, a frequency analysis is applied to the measurement results after transforming the results into frequency domain by the means of e.g. fast Fourier transform (FFT). Any other feasible mathematical or non-mathematical method enabling the observation of the measurement results in a frequency domain can be used, such as filtering out the non-interesting frequencies. The measurement can be carried out during a steady state condition or during a transient operation (starting up or shutting down) of the electrical machine. In the context of the present invention any analysing technique requiring the use of frequency information, such as Hilbert transform or wavelet decomposition, is considered as a frequency analysis 250.

From the frequency analysis of the circulating current a number of frequency components will be available. The amplitudes of these frequency components are compared with reference values known to be characteristic for certain fault conditions. The reference values can be obtained from computer simulation where different fault conditions are induced in a simulation model corresponding to the electrical machine of interest. The reference values can also be obtained from measurements on a real machine where a certain fault condition is intentionally induced or otherwise known. The reference values can be collected in a look-up table listing all known reference values and fault conditions they are associated with.

Referring to FIG. 3, a look-up table for fault indication may comprise columns corresponding to different fault conditions and rows corresponding to certain reference frequencies. The frequency or frequencies associated with a certain fault condition are marked on the look-up table taking a dominance of the amplitude into account. For example, an existence of a frequency component with a value $kf_r$, wherein k=(1, 2, 3, . . . ) and $f_r$=rotational frequency of the electrical machine, indicates that the machine suffers from inter-turn short circuit in the rotor 220.

Although in a healthy machine the circulating current amplitudes at the given frequencies are close to zero, an existence of a certain frequency component as such does not necessarily mean that there is a fault condition. The appearance of a frequency component is recognized as an indication of a fault condition only if the circulating current amplitude at that frequency exceeds a certain threshold value. A frequency component with a small amplitude may occur at normal asymmetries of the machine, or it may be an indication of an approaching defect that has not yet evolved into a fault condition so severe that corrective measures need to be taken. The fault indicators can further be normalized in order to account for different electrical machines, regardless of their size and/or design.

When determining a threshold value for an amplitude of the circulating current at a frequency component, above which the oscillation shall be recognized as an indication of a fault condition, differences between circulating current amplitudes caused by changes in operating conditions mean that it is not necessarily feasible to determine a threshold value in terms of an absolute amplitude value. Instead, it has been found to be more feasible to determine a relative circulating current amplitude according to an algorithm $$\text{Fault\_indicator} = \sum_{i=1}^{n} \left( \frac{\text{RMS}(I_c)}{I_{rated}} - \left| 20 \log \frac{A_{fault\_related\_frequency,i}}{A_{main}} \right| \right)$$

where Fault_indicator is the relative amplitude which is to be compared with the threshold value, $\text{RMS}(I_c)$ is the root mean square of the circulating current at a given frequency component, $I_{rated}$ is the rated current of the machine i.e. the current at full load of the machine, $A_{fault\_related\_frequency,i}$ is an amplitude of the circulating current at the $i^{th}$ frequency component, n is the number of frequency components and $A_{main}$ is an amplitude of the main current at supply frequency. The relative amplitude which is to be compared with the threshold value is thus invariant to changes in operating conditions and may be easily compared against a scalar threshold value. The algorithm can also comprise a normalizing factor to account for different electrical machines, regardless of their size and/or design.

The frequency signatures of FIG. 3 apply to a certain synchronous motor, and the results can be used to detect fault conditions in synchronous machines of the same type. However, the present method is not limited to the diagnosis of certain types of electrical machines, and it is especially not limited to diagnosis of synchronous machines. On the contrary, the present method can be applied to any electrical machine, such as an electrical motor or an electrical generator, in which at least the stator 120 or the rotor 220 has parallel winding branches 30, . . . 60, 130, . . . 180. Especially, the present method can be applied to induction machines. The present method can be used with circulating current values obtained from the rotor 220, although in practice it is easier to measure the circulating currents 85 from the stator 120.

Referring to FIG. 4, the present method comprises three major steps: a measurement 230 resulting in a set of circulating current values 240; a frequency analysis 250 resulting in at least one frequency component 260; and a fault condition identification 270 resulting in an eventual determination of a fault condition 280.

The invention is not limited to the embodiments shown above, but a person skilled in the art may modify them in a plurality of ways within the scope of the invention as defined by the claims.

The invention claimed is:

1. A method for identifying a fault condition in an electrical machine in which at least a stator or a rotor has electrically parallel winding branches, the method comprising the steps of:
   taking a first measurement, via at least one current sensor implemented in the electrical machine, for obtaining a first set of circulating current values between two electrically parallel winding branches, wherein each winding branch comprises a single coil;
   applying, via a processor, a frequency analysis on the first set of circulating current values to obtain at least one frequency component;
   identifying, via the processor, on the basis of the at least one frequency component, a type of fault condition of the electrical machine;
   wherein the method comprises at least one of the following steps performed via the processor:
      determining, on the basis that the at least one frequency component has a value $(2k+1)f_s \pm f_r$, wherein $k=(2, 3, \ldots )$, $f_s$=supply frequency and $f_r$=rotational frequency of the electrical machine, that the machine suffers from dynamic eccentricity;
      determining, on the basis that the at least one frequency component has a value $kf_s$, wherein $k=(2, 3, \ldots )$ and $f_s$=supply frequency, that the machine suffers from static eccentricity; and
      determining, on the basis that the at least one frequency component has a value $(2k+1)f_s$, wherein $k=(1, 2, 3, \ldots )$ and $f_s$=supply frequency, that the machine suffers from inter-turn short circuit in the stator;
   performing maintenance on the electrical machine when the type of fault condition is identified.

2. The method according to claim 1, wherein the electrical machine is a synchronous electrical motor or generator.

3. The method according to claim 1, wherein the at least one current sensor comprises two current sensors for obtaining branch current signals from the two electrically parallel winding branches, and wherein the first set of circulating current values is calculated from the branch current signals using an operational amplifier of the processor or using a numerical subtraction after the branch current signals have been converted into a digital domain.

4. The method according to claim 1, wherein the at least one current sensor comprises a differential current sensor.

5. The method according to claim 4, wherein the first measurement is carried out between two opposite winding branches in circumferential direction of the stator, the at least one current sensor being arranged at the two opposite winding branches in the circumferential direction of the stator.

6. The method according to claim 1, wherein the method comprises the step of:
   carrying out a second measurement corresponding to the first measurement, the two electrically parallel winding branches in the second measurement being different from those in the first measurement.

7. The method according to claim 6, wherein the two electrically parallel winding branches in the second measurement are in a different electrical phase than those in the first measurement.

8. The method of claim 6, further comprising the step of applying a space-frequency analysis, via the processor, to the first measurement and second measurement to extract spatial information to locate a position of the fault condition.

9. The method according to claim 1, wherein the method comprises the step of:

carrying out a measurement corresponding to the first measurement for winding branches in each electrical phase of the electrical machine.

10. The method according to claim 1, wherein a fault condition of the electrical machine is determined on the basis of more than one frequency component.

11. The method according to claim 1, wherein the method comprises the step of:
comparing an amplitude of the circulating current at the frequency component with a predetermined threshold value.

12. The method of claim 11, further comprising the step of using a computer simulation to obtain the predetermined threshold value, wherein different types of fault conditions are simulated in a simulation model corresponding to the electrical machine.

13. The method according to claim 1, wherein the method comprises the step of:
comparing a relative amplitude of the circulating current at the frequency component with a predetermined threshold value, wherein the relative amplitude is determined by an algorithm comprising a root mean square of the circulating current at the frequency component.

14. The method according to claim 1, wherein the first measurement is carried out during a transient operation of the electrical machine.

15. The method of claim 1, wherein the at least one current sensor is integrated into the two electrically parallel winding branches of the electrical machine.

16. The method of claim 1, further comprising the step of locating a position of the fault condition within the electrical machine when the type of fault condition is identified;
wherein the step of performing maintenance comprises performing maintenance on the electrical machine at the position of the fault condition.

17. A method for identifying a fault condition in an electrical machine in which at least a stator or a rotor has electrically parallel winding branches, the method comprising the steps of:
taking a first measurement, via at least one current sensor implemented in the electrical machine, for obtaining a first set of circulating current values between two electrically parallel winding branches, wherein each winding branch comprises a single coil;
applying, via a processor, a frequency analysis on the first set of circulating current values to obtain at least one frequency component;
comparing, via the processor, a relative amplitude of the circulating current at the frequency component with a predetermined threshold value, wherein the relative amplitude is determined by an algorithm comprising a factor $$20 \log \frac{A_{fault\_related\_frequency}}{A_{main}},$$

where $A_{fault\_related\_frequency}$ is an amplitude of the circulating current at the frequency component and $A_{main}$ is an amplitude of a main current at supply frequency; and
identifying, via the processor, on the basis of the at least one frequency component, a type of fault condition of the electrical machine;
wherein the method comprises at least one of the following steps performed via the processor:
determining, on the basis that the at least one frequency component has a value $(2k+1)f_s \pm f_r$, wherein $k=(2, 3, \ldots)$, $f_s$=supply frequency and $f_r$=rotational frequency of the electrical machine, that the machine suffers from dynamic eccentricity;
determining, on the basis that the at least one frequency component has a value $kf_s$, wherein $k=(2, 3, \ldots)$ and $f_s$=supply frequency, that the machine suffers from static eccentricity; and
determining, on the basis that the at least one frequency component has a value $(2k+1)f_s$, wherein $k=(1, 2, 3, \ldots)$ and $f_s$=supply frequency, that the machine suffers from inter-turn short circuit in the stator;
performing maintenance on the electrical machine when the type of fault condition is identified.

18. A method for identifying a fault condition in an electrical machine in which at least a stator or a rotor has electrically parallel winding branches, the method comprising the steps of:
taking a first measurement, via at least one current sensor implemented in the electrical machine, for obtaining a first set of circulating current values between two electrically parallel winding branches, wherein each winding branch comprises a single coil;
applying, via a processor, a frequency analysis on the first set of circulating current values to obtain at least one frequency component;
comparing, via the processor, a relative amplitude of the circulating current at the frequency component with a predetermined threshold value, wherein the relative amplitude is determined by an algorithm $$\sum_{i=1}^{n} \left( \frac{RMS(I_c)}{I_{rated}} - \left| 20 \log \frac{A_{fault\_related\_frequency,i}}{A_{main}} \right| \right),$$

where $RMS(I_c)$ is root mean square of the circulating current at the frequency component, $I_{rated}$ is the rated current of the machine, $A_{fault\_related\_frequency,i}$ is an amplitude of the circulating current at the $i^{th}$ frequency component, n is the number of frequency components and $A_{main}$ is an amplitude of a main current at supply frequency; and
identifying, via the processor, on the basis of the at least one frequency component, a type of fault condition of the electrical machine;
wherein the method comprises at least one of the following steps performed via the processor:
determining, on the basis that the at least one frequency component has a value $(2k+1)f_s \pm f_r$, wherein $k=(2, 3, \ldots)$, $f_s$=supply frequency and $f_r$=rotational frequency of the electrical machine, that the machine suffers from dynamic eccentricity;
determining, on the basis that the at least one frequency component has a value $kf_s$, wherein $k=(2, 3, \ldots)$ and $f_s$=supply frequency, that the machine suffers from static eccentricity; and
determining, on the basis that the at least one frequency component has a value $(2k+1)f_s$, wherein $k=(1, 2, 3, \ldots)$ and $f_s$=supply frequency, that the machine suffers from inter-turn short circuit in the stator
locating a position of the fault condition within the electrical machine when the type of fault condition is identified; and
performing maintenance on the electrical machine at the position of the fault condition.

* * * * *